United States Patent
Lee

(10) Patent No.: US 6,503,810 B2
(45) Date of Patent: Jan. 7, 2003

(54) METHOD FOR FORMING A CAPACITOR FOR SEMICONDUCTOR DEVICES WITH AN AMORPHOUS $LI_xTA_{1-x}O_3$ DIELETRIC LAYER HAVING A PEROVSKITE STRUCTURE

(75) Inventor: Kee Jeung Lee, Seoul (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/750,035

(22) Filed: Dec. 29, 2000

(65) Prior Publication Data

US 2001/0006826 A1 Jul. 5, 2001

(30) Foreign Application Priority Data

Dec. 29, 1999 (KR) .............................. 99 64611

(51) Int. Cl.[7] .............................................. H01L 21/20
(52) U.S. Cl. ........................ 438/396; 438/3; 438/240; 438/785
(58) Field of Search ................... 438/396, 239, 438/240, 241, 250, 257, 3, 785, 322; 257/295, 751, 766

(56) References Cited

U.S. PATENT DOCUMENTS

| | | | | |
|---|---|---|---|---|
| 4,130,694 | A | * 12/1978 | Glass et al. | ................. 429/193 |
| 6,054,331 | A | * 4/2000 | Woo et al. | ...................... 438/3 |
| 6,094,292 | A | * 7/2000 | Gerouki | ..................... 438/155 |
| 6,194,754 | B1 | * 2/2001 | Aggarwal et al. | .......... 257/295 |

FOREIGN PATENT DOCUMENTS

| | | | | |
|---|---|---|---|---|
| JP | 59045999 | * | 6/1982 | ........... C30B/29/30 |
| JP | 06151762 | * | 11/1992 | ......... H01L/27/108 |
| JP | 06151762 | * | 5/1994 | ......... H01L/27/108 |

* cited by examiner

Primary Examiner—Olik Chaudhuri
Assistant Examiner—Yennhu B. Huynh
(74) Attorney, Agent, or Firm—Pillsbury Winthrop LLP

(57) ABSTRACT

A method for forming a capacitor for semiconductor devices is provided. In the method, a storage electrode is formed on a semiconductor wafer, and the surface of the storage electrode is nitridated so as to prevent reduction of the dielectric strength by an oxide layer that is possibly formed on the storage electrode. Then, a dielectric layer is formed of a $Li_xTa_{1-x}O_3$ layer having a stable structure and a large dielectric constant ($\epsilon$=45), and a plate electrode is formed on the dielectric layer, thereby resulting in a capacitor. The capacitor has high capacitance values enough for high-integration semiconductor devices with smaller sizes.

19 Claims, 3 Drawing Sheets

- Li ion
- Ta ion
- Oxygen

METHOD FOR FORMING A CAPACITOR FOR SEMICONDUCTOR DEVICES WITH AN AMORPHOUS $LI_xTA_{1-x}O_3$ DIELETRIC LAYER HAVING A PEROVSKITE STRUCTURE

BACKGROUND OF THE INVENTION

1. Field of the Invention

The present invention relates to a method for forming a capacitor for semiconductor devices, and more particularly, to a method for fabricating capacitors for semiconductor devices that provide the increased levels of capacitance necessary for more highly integrated devices, wherein a dielectric layer is formed of a material having a large dielectric constant and a stable stoichiometric structure.

2. Description of the Related Art

Recently, as the level of integration in semiconductor devices increases, research and development on semiconductor devices have been directed toward both reducing the cell area and reducing the device operating voltage. Although high levels of device integration greatly reduces the wafer area available for capacitor formation, the charge capacity preferred for operation of a memory device remains on the order of at least 25 fF per cell despite the reduction in cell area. This level of charge is useful in preventing the generation of soft errors and avoiding reductions in the refresh time.

To obtain sufficient capacitance values, conventional DRAM capacitors commonly use a dielectric film having a stacked nitride/oxide (NO) structure or an oxide-nitride-oxide (ONO) structure; a three-dimensional lower electrode structure, such as a cylinder; and/or reduced dielectric thickness. Despite these measures, however, the NO and ONO dielectric are generally unable to provide sufficient capacitance within the cell dimensions required for highly integrated (256M and above) semiconductor devices. Accordingly, efforts to increase the capacitance values have sought to replace the conventional oxide layer, the NO dielectric layer or the ONO dielectric layer with a metal based dielectric layer, such as $Ta_2O_5$ or BST ($BaSrTiO_3$) that provide a significantly increased dielectric constant ($\epsilon$) in the range of approximately 20 to 25.

In particular, in DRAM designs using a nitride-oxide (NO) structure as the dielectric film, it has been typically necessary to utilize electrode structure having hemispherical grains (HSGs) formed on the surface of the storage electrode of the DRAM. The three-dimensional electrode structures with the hemispherical grain surfaces increase the effective surface area of the electrode to obtain the necessary capacitance values by increasing the height and vertical surface area of the electrode. However, increasing the height of the capacitor causes a step difference between the cell area and peripheral circuit area. Such step difference in turn introduces focal depth problems which compromise accuracy in the subsequent pattern formation process steps, such as photolithography and etch processes, that are usually performed after an interconnection process in the manufacture of semiconductor devices. Therefore, conventional capacitors formed of the NO layer have limitations in applications for 256 megabytes or greater future generation DRAMs that require a large capacitance.

In order to overcome such limitations as one described above associated with capacitors having a NO dielectric layer, active research and development are being conducted in designing capacitors with a $Ta_2O_5$ layer, which has a large dielectric constant. However, a nominal $Ta_2O_5$ film has an unstable stoichiometry that inevitably generates Ta atoms with oxygen vacancies in the thin dielectric layer due to the unbalanced composition ratio between the Ta and O atoms within the film. Accordingly, there is a need to stabilize the $Ta_2O_5$ layer by oxidizing Ta atoms existing in the thin dielectric layer, thereby preventing the generation of a leakage current in the capacitor.

Additionally, the $Ta_2O_5$ film is highly reactive with both doped polysilicon and metal based materials, such as titanium nitride (TiN), two materials commonly used to form the plate electrode and storage electrode adjacent the dielectric layer. As a result, oxygen present in the $Ta_2O_5$ thin film may react with the electrode materials, thereby forming a low dielectric oxide layer at the interface and degrading the uniformity and electrical properties of the resulting capacitor.

During the formation of the $Ta_2O_5$ layer, the organic portions from $Ta(OC_2H_5)_5$—which is a precursor compound for $Ta_2O_5$—can reacts with $O_2$ or $N_2O$ gas to form various impurities such as carbon (C) atoms, carbon compounds including $CH_4$ and $C_2H_4$, and water vapor ($H_2O$) in the $Ta_2O_5$ layer. As a result of such impurities, as well as other ions or radicals present in the $Ta_2O_5$ film, the resulting capacitors tend to exhibit increased leakage current and degraded dielectric characteristics.

SUMMARY OF THE INVENTION

To solve the above problems and limitations experienced with and/or inherent in prior art processes and materials, it is an object of the present invention to provide a method for forming a capacitor for semiconductor devices, which ensures sufficient capacitance to support advanced, high-density semiconductor devices.

In one embodiment, the present invention provides a method for forming a capacitor for semiconductor devices, the method comprising: preparing a semiconductor wafer; forming a storage electrode with a conductive layer on the semiconductor wafer; forming a dielectric layer with a $Li_xTa_{1-x}O_3$ layer having a perovskite structure on the storage electrode, where X=0.25–0.75; and forming a plate electrode including at least one conductive layer on the dielectric layer.

In another embodiment, the present invention provides a method for forming a capacitor for semiconductor devices, the method comprising: preparing a semiconductor wafer; forming a storage electrode with a conductive layer on the semiconductor wafer; performing nitridation on the surface of the storage electrode; forming a dielectric layer with a $Li_xTa_{1-x}O_3$ layer having a perovskite structure on the storage electrode, where X=0.25–0.75; and forming a plate electrode including at least one conductive layer on the dielectric layer.

The present invention will become better understood in light of the following detailed description, the accompanying figures and the appended claims. The figures are provided by way of illustration only and are not intended to limit the scope of the invention.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Figure 1:
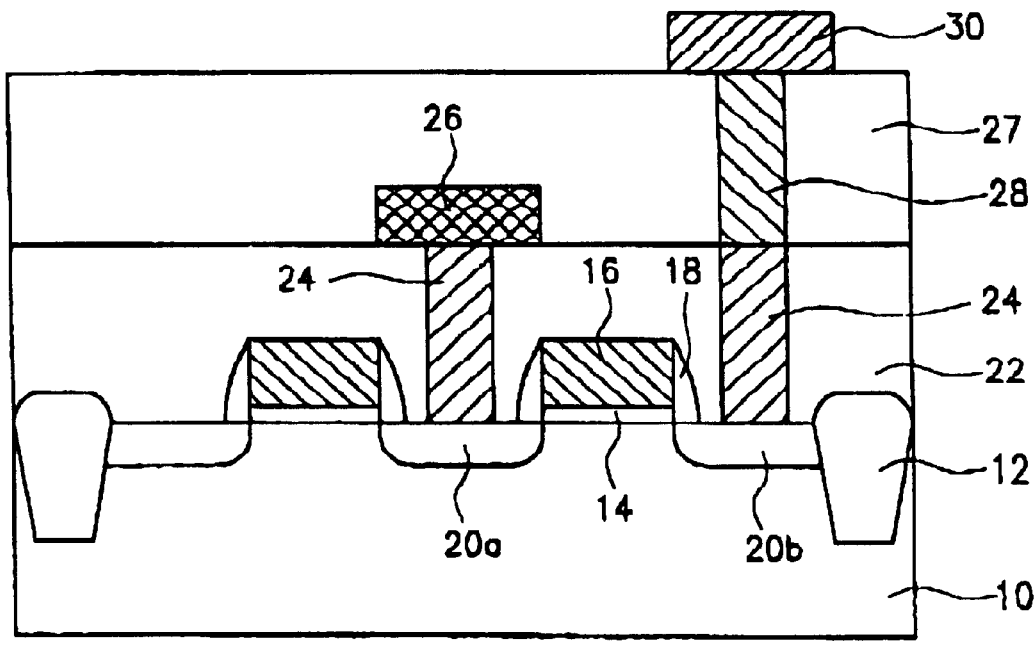
FIGS. 1 through 4 are sectional views illustrating certain of the successive steps in manufacturing a capacitor for semiconductor devices according to the present invention.

A method for forming capacitors for semiconductor devices according to the present invention will be described in greater detail with reference to FIGS. 1 through 4. As shown in FIG. 1, a field oxide layer 12 is formed on a p-type semiconductor wafer 10; a gate oxide layer 14 is formed in the active region of the semiconductor wafer 10 between field oxide layers 12; a gate electrode 16, formed of a conductive material such as a doped polysilicon, is formed on the gate electrode 16; and a spacer 18 is formed on both sidewalls of the gate oxide layer 14 and the gate electrode 16. Further, source/drain junction regions 20a and 20b are formed by implanting impurity ions into a region between the gate electrode 16 and the field oxide layer 12, thereby forming a general cell transistor.

Next, after depositing an interlayer dielectric (ILD) film 22 over the semiconductor wafer 10, a contact hole (not shown) is formed by etching the deposited interlayer dielectric film over a junction region surrounded by the spacer 18 formed on the sidewalls of the gate electrode 16. When etched, the surface of the semiconductor wafer 10 is exposed through the contact hole. The contact hole is then filled with a lower contact plug 24 that is to be connected with either a bit line or the storage electrode in a perpendicular manner. Next, by an interconnection process, a bit line 26 which is to be in contact with the contact plug 24 is formed. A second ILD film 27 for planarization is then deposited over the semiconductor wafer 10, and an upper contact plug 28 is connected to the lower contact plug 24 in a perpendicular manner.

Subsequently, a capacitor is formed on the resultant structure in accordance with the present invention. In one embodiment, a storage electrode is formed in a common stack structure. In particular, a doped polysilicon is deposited over the second ILD film 27 and is then patterned and etched to form storage electrode 30. Here, to increase the surface area of the storage electrode 30, a metastable polysilicon (MPS) process can be performed, and a metal can be used to prevent oxidation of the doped polysilicon storage electrode 30 and a dielectric layer and to improve insulation properties. Suitable metals for such purposes may include TaN, W, WN, WSi, Ru, RuO$_2$, Ir, IrO$_2$ and Pt.

Figure 2:
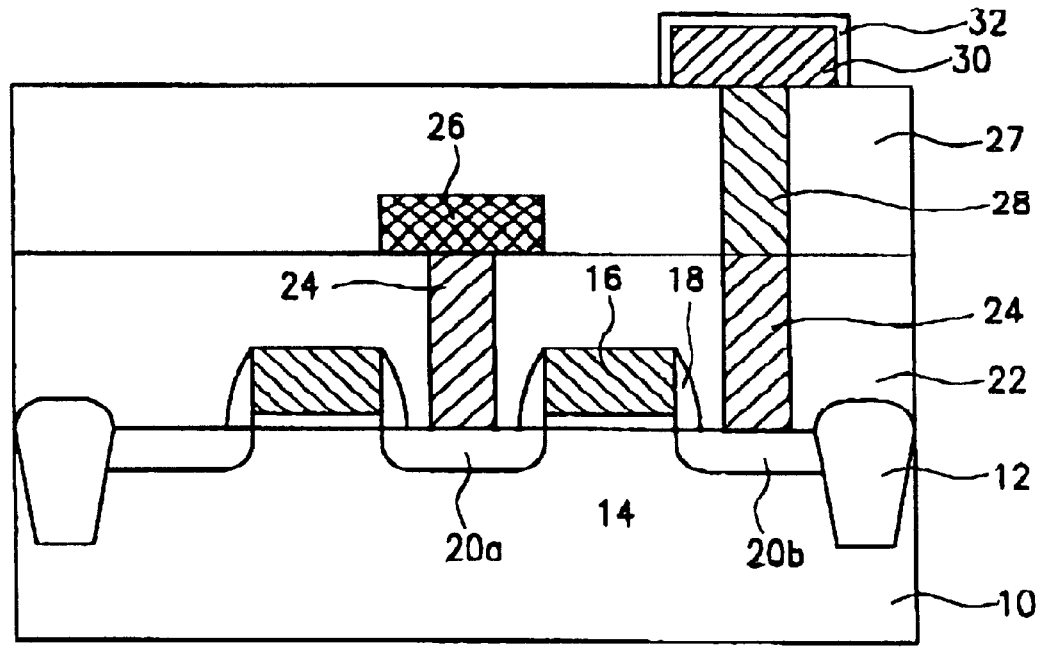

Next, as shown in FIG. 2, in order to prevent formation of an oxide layer having a small dielectric constant—such as SiO$_2$ layer—at the interface between the storage electrode 30 and an amorphous LiTaO$_3$ layer to be formed as a dielectric layer during a subsequent high-temperature process, a Si$_3$N$_4$ or SiON layer 32 is formed on the storage electrode 30. The Si$_3$N$_4$ or SiON layer 32 can be formed in-situ at a temperature of between about 200° C. and 500° C. in an NH$_3$ or N$_2$ atmosphere using plasma. Alternatively, the Si$_3$N$_4$ or SiON layer 32 can be formed by rapid thermal nitridation (RTN) at a temperature of between about 750° C. and 950° C. for about 1 to 5 minutes.

Afterwards, a natural oxide layer can be removed using a HF gas or HF solution. It is preferable that, before and after the removal of the natural oxide layer, the surface of the resultant structure be treated using an NH$_4$OH or H$_2$SO$_4$ solution to obtain a clean and uniform surface.

Figure 3:
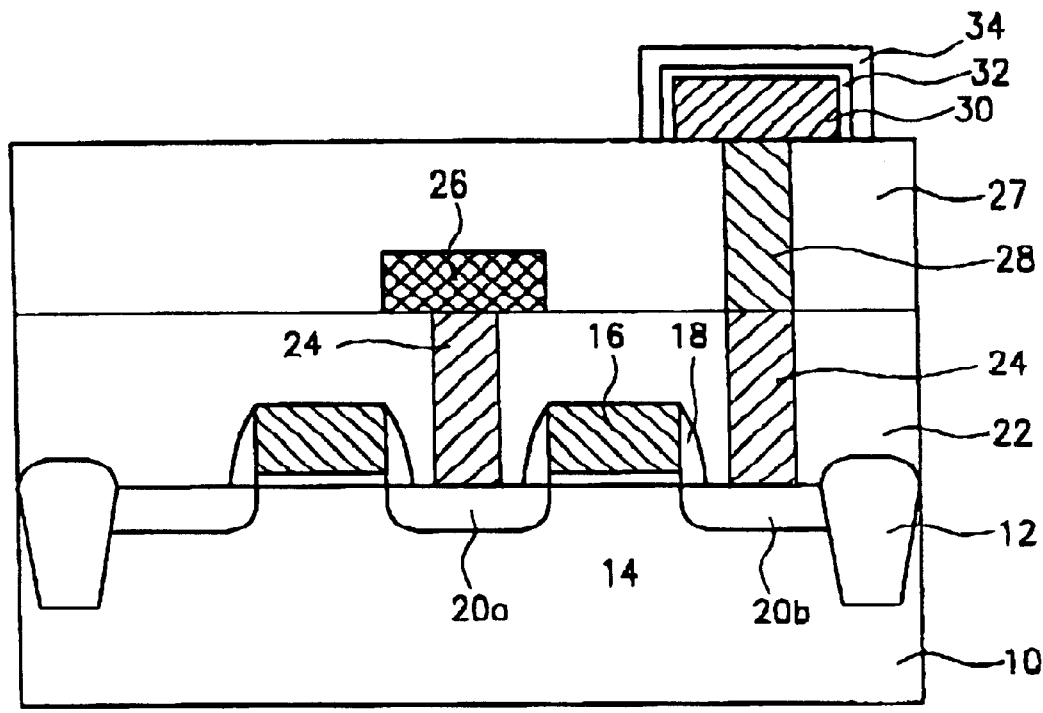

As shown in FIG. 3, a dielectric layer 34, formed of amorphous Li$_x$Ta$_{1-x}$O$_3$ having a dielectric constant ($\epsilon$) of 45 or greater, is formed on the Si$_3$N$_4$ or SiON layer 32 with a thickness of less than 150 Å. Here, Ta source gas for the amorphous Li$_x$Ta$_{1-x}$O$_3$ layer is produced by evaporating a Ta(OC$_2$H$_5$)$_5$ solution supplied into an evaporator through a mass flow controller, at a temperature of between about 150° C. and 200° C. Li source gas for the Li$_x$Ta$_{1-x}$O$_3$ layer is produced by evaporating a saturated or supersaturated Li solution supplied into an evaporator through a mass flow controller, at a temperature of between about 100° C. and 400° C. The Li solution is prepared by dissolving a Li compound, such as lithium acetate (C$_2$H$_2$LiO$_2$), lithium hydroxide (LiOH) or lithium oxide (Li$_2$O), in deionized water or an alcohol such as ethanol or butanol.

The Ta source gas is supplied into a reaction chamber—such as a low-pressure chemical vapor deposition (LPCVD) chamber—and is supplied in a uniform fashion above a semiconductor wafer through a shower head installed at the upper part of the chamber in the direction perpendicular to the semiconductor wafer. Alternatively, the Ta source gas can be supplied into the reaction chamber using an injector installed at the upper part of the chamber, which also allows uniform distribution of the source gas over the semiconductor wafer in either a parabolic flow pattern or a counter flow pattern.

At this point, the preferred mole ratio of Ta/Li is within the range of about 0.1 to 10, and the amorphous Li$_x$Ta$_{1-x}$O$_3$ layer—with X being about 0.25 to 0.75—is deposited by LPCVD as a surface chemical reaction is smoothly induced with suppressed gas phase reaction. In addition, to remove impurities from the dielectric layer, excess O$_2$ or N$_2$O gas can be further provided at a range between about 5 sccm and 500 sccm along with the Ta source gas. Alternatively, with the mole ratio of Ta/Li within a range of about 0.1 to 10, the amorphous Li$_x$Ta$_{1-x}$O$_3$ layer as a dielectric layer can be deposited by chemical vapor deposition (CVD).

After the dielectric layer 34 of Li$_x$Ta$_{1-x}$O$_3$ is deposited, a low-temperature annealing process is carried out at a temperature of 600° C. or less in an O$_2$ or N$_2$O atmosphere. Alternatively, the low-temperature annealing can be carried out at a temperature in a range of about 300° C. and 600° C. in an O$_3$ atmosphere with UV light, in an O$_3$ and N$_2$O atmosphere or in an O$_2$ atmosphere using plasma. The reason for performing low-temperature annealing is to induce crystallization of the amorphous layer by removing moisture or impurities remaining as byproducts, such as carbon compounds, thereby increasing the dielectric constant. During the low-temperature annealing process, impurities from the dielectric layer 34 evaporate as CO or CO$_2$, so that the resultant dielectric layer has a superior quality.

Figure 4:
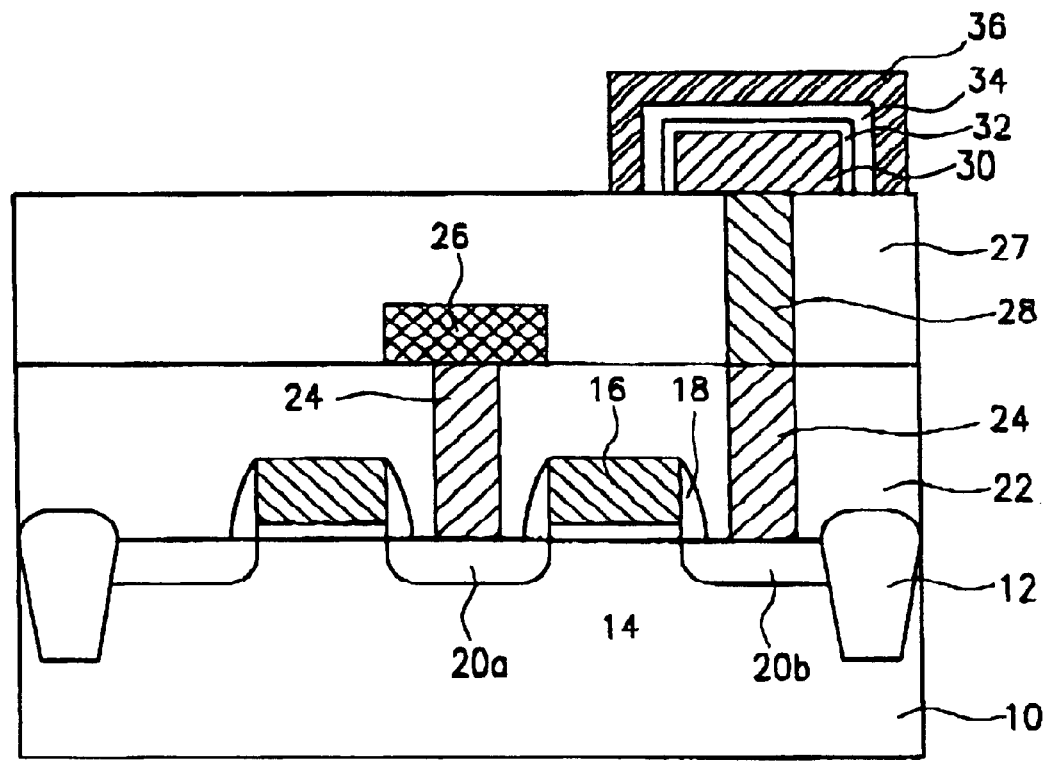

Following this, as shown in FIG. 4, a plate electrode 36 including at least one conductive layer is deposited over the dielectric layer 34. The conductive layer may be formed of a doped polysilicon layer, a metal layer, or a multi-layer configuration of dope polysilicon and metal. Suitable metals for the conductive layer may include TaN, W, WN, WSi, Ru, RuO$_2$, Ir, IrO$_2$ and Pt. In the present embodiment, the plate electrode 36 is formed by depositing a TaN layer and a doped polysilicon layer in succession on the dielectric layer 34, and patterning these layers. As a result, a capacitor manufactured according to the present invention has high capacitance values required for high-integrated semiconductor devices.

Figure 5:
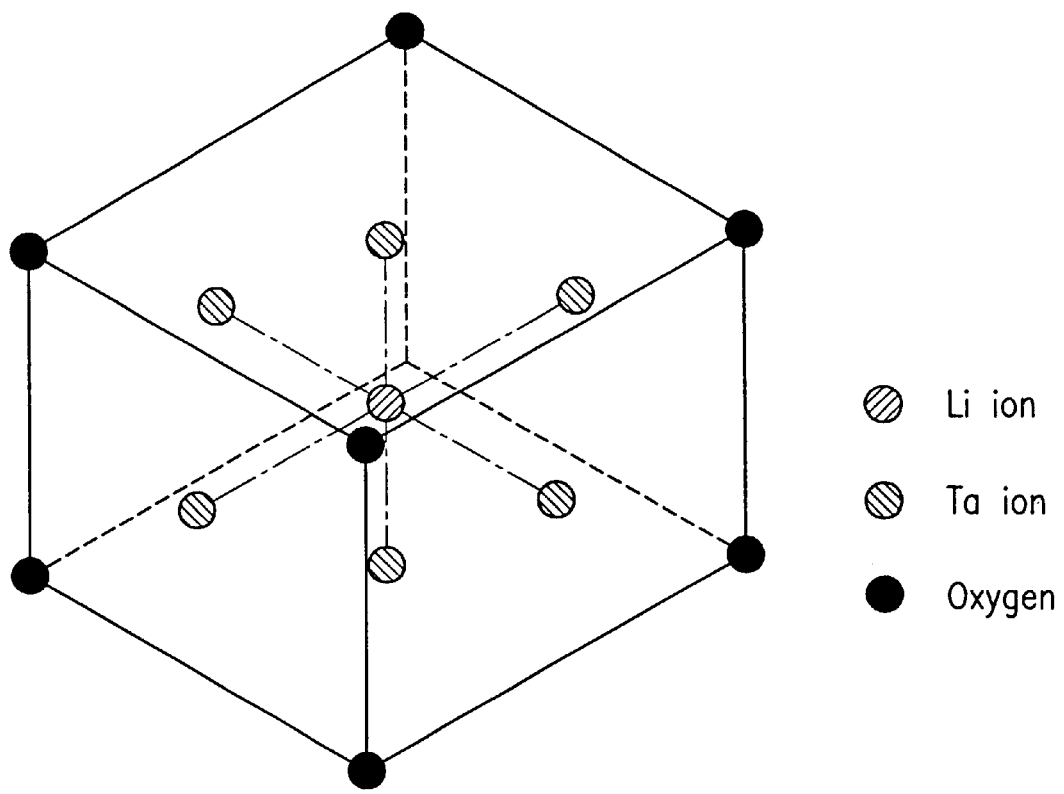
FIG. 5 illustrates the perovskite structure of amorphous LiTaO$_3$, which is used to form a dielectric layer in manufacturing a capacitor for semiconductor devices according to the present invention.

FIG. 5 illustrates the perovskite structure of amorphous $LiTaO_3$, which is used to form the dielectric layer for a capacitor for semiconductor devices according to the present invention. As shown in FIG. 5, $Li^{1+}Ta^{5+}O_3$ present a stable cubic lattice.

Figure 6:
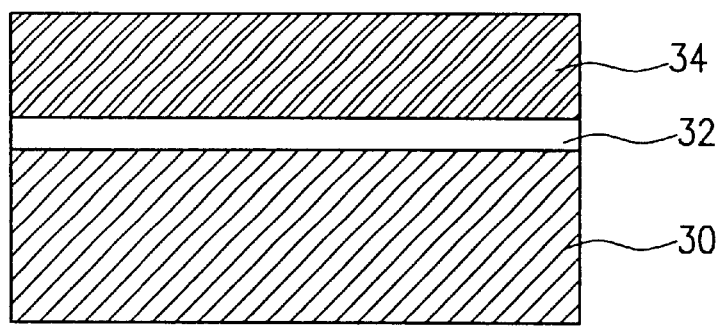
FIG. 6 is a sectional view illustrating the deposition of the amorphous LiTaO$_3$ layer and removal of impurities from the amorphous layer in manufacturing a capacitor for semiconductor devices according to the present invention.

FIG. 6 is a sectional view illustrating the deposition of the amorphous $LiTaO_3$ layer and the removal of impurities from the amorphous layer in the manufacture of a capacitor of a semiconductor device according to the present invention. When 10 the amorphous $LiTaO_3$ is deposited as the dielectric layer 34, a Li compound—such as lithium acetate ($C_2H_2LiO_2$), lithium hydroxide (LiOH) or lithium oxide ($Li_2O$)—is used as a precursor for Li, as previously mentioned. Such a Li compound has a highly affinity to byproducts, such as carbon compounds oxides and water, from the chemical surface reaction which takes place during the deposition of the dielectric layer 34. The carbon compound oxides or water absorbed by the Li compound evaporates as CO, $CO_2$ or $H_2O$ during a low-temperature annealing process. As a result, the impurities are removed from the dielectric layer 34.

Therefore, the problems of the conventional $Ta_2O_5$ layer having an unstable stoichiometry, i.e., a high leakage current and a low breakdown voltage, which are caused due to the presence of Ta atoms with oxygen vacancies, and carbon impurities, can be avoided by use of the amorphous $LiTaO_3$.

The method for forming a capacitor for semiconductor devices according to the present invention is advantageous in terms of the following aspects. The capacitor manufactured according to the present invention has a dielectric layer of $LiTaO_3$ having a large dielectric constant ($\epsilon$>45), so as to achieve a higher capacitance value than can be achieved with the conventional NO film ($\epsilon$=4–5) or $Ta_2O_5$ film ($\epsilon$=25). Due to the large dielectric constant of the $LiTaO_3$ layer, there is no need to form a 3-dimensional capacitor module with complicated structure in order to increases the surface area of the storage electrode. In other words, a high capacitance is ensured by a simple stack capacitor, so that the capacitor manufacturing process can be simplified.

In addition, since the $LiTaO_3$ dielectric layer has a stable perovskite structure, mechanical strength and resistance to electrical shock (ESD) are improved over the conventional dielectric layers such as NO and $Ta_2O_5$ layers. Also, the occurrence of leakage currents can be reduced. Furthermore, according to the present invention, impurities such as carbon compounds and water, which remain in the dielectric layer after the deposition of the dielectric layer, can be removed by a low-temperature annealing process, without need for a high-temperature annealing process, thereby reducing the leakage current level.

The method according to the present invention ensures the high capacitance value more than 25 fF/cell preferred for the operation of DRAM's with of a 256 megabytes or greater that have reduced effective unit cell area. Furthermore, even when the thickness of equivalent oxide layer of a capacitor is kept less than 30 Å, the dielectric strength of more than 9MV/cm and the leakage current of less than 1 fA/cell can be ensured, which improves the properties and reliability of the resulting semiconductor device.

What is claimed is:

1. A method for forming a capacitor for semiconductor devices, the method comprising:
    preparing a semiconductor wafer;
    forming a storage electrode with a conductive layer on the semiconductor wafer;
    forming a dielectric layer with an amorphous $Li_xTa_{1-x}O_3$ layer having a perovskite structure on the storage electrode, where X is between about 0.25 and 0.75; and
    forming a plate electrode including at least one conductive layer on the dielectric layer.

2. The method of claim 1, wherein a Ta source gas for the amorphous $Li_xTa_{1-x}O_3$ layer is produced by evaporating a $Ta(OC_2H_5)_5$ solution supplied into an evaporator through a mass flow controller, at a temperature in a range of about 150° C. and 200° C.; a Li source gas for the $Li_xTa_{1-x}O_3$ layer is produced by evaporating a Li solution supplied into an evaporator through a mass flow controller, at a temperature in a range of about 100° C. and 400° C.; and the Li solution is prepared by dissolving a Li compound selected from the group comprising lithium acetate ($C_2H_2LiO_2$), lithium hydroxide (LiOH) and lithium oxide ($Li_2O$) in deionized water or alcohol.

3. The method of claim 1, wherein a mole ratio of Ta/Li for the $Li_xTa_{1-x}O_3$ layer is in a range of about 0.1 to 10, and the amorphous $Li_xTa_{1-x}O_3$ layer is deposited in a low-pressure chemical vapor deposition (LPCVD) chamber through a surface chemical reaction while a gas phase reaction is suppressed.

4. The method of claim 3, wherein, during the deposition of the amorphous $Li_xTa_{1-x}O_3$ layer, excess $O_2$ or $N_2O$ gas is further provided at about 5 sccm to 500 sccm along with the Ta source gas to remove impurities from the dielectric layer.

5. The method of claim 1, wherein, after forming the dielectric layer with the $Li_xTa_{1-x}O_3$ layer, an annealing process is carried out at a temperature of less than about 600° C. in an $O_2$ or $N_2O$ atmosphere, or at a temperature in a range of about 300° C. and 600° C. in one of an $O_3$ atmosphere with UV light, an $O_3$ and $N_2O$ atmosphere and an $O_2$ atmosphere using plasma.

6. The method of claim 1, wherein, in forming the dielectric layer with the $Li_xTa_{1-x}O_3$ layer, the Ta source gas is supplied into a reaction chamber and provided above the semiconductor wafer through a shower head installed at an upper part of the reaction chamber in a direction perpendicular to the semiconductor wafer.

7. The method of claim 1, wherein, in forming the dielectric layer with the $Li_xTa_{1-x}O_3$ layer, a Ta source gas is supplied into a reaction chamber using an injector installed at an upper part of the reaction chamber to allow uniform counter flow of the source gas over the semiconductor wafer.

8. The method of claim 1, wherein the conductive layer of the storage electrode is formed of doped polysilicon.

9. The method of claim 8, wherein the method further comprises performing nitridation on a surface of the storage electrode in-situ after the deposition of doped polysilicon.

10. The method of claim 9, wherein, in performing nitridation on the surface of the storage electrode, the surface of the storage electrode is subject to one of:
    annealing at a temperature in a range of about 200° C. and 500° C. in one of a $NH_3$ atmosphere and a $N_2$ atmosphere using plasma, and
    a rapid thermal nitridation (RTN) at a temperature in a range of about 750° C. and 950° C. for about 1 to 5 minutes.

11. The method of claim 1, wherein the method further comprises removing a natural oxide layer using a HF gas or a HF solution after forming the storage electrode.

12. The method of claim 11, wherein a surface of the storage electrode is treated using one of a $NH_4OH$ solution and a $H_2SO_4$ solution to make the surface of the storage electrode clear or uniform before and after removing the natural oxide layer.

13. The method of claim 1, wherein the conductive layer of the storage electrode is formed of a metal layer or a multi-layer configuration of metal and doped polysilicon layers.

14. The method of claim 1, wherein the at least one conductive layer of the plate electrode is formed of one of a doped polysilicon layer, a metal layer, and a multi-layer configuration comprising a polysilicon layer and a metal layer.

15. The method of claim 14, wherein the metal layer comprises at least one material selected from a group consisting of TaN, W, WN, WSi. Ru, $RuO_2$, Ir, $IrO_2$ and Pt.

16. A method for forming a capacitor of a semiconductor device, the method comprising:

preparing a semiconductor wafer;

forming a storage electrode with a conductive layer on the semiconductor wafer;

performing nitridation on the surface of the storage electrode;

forming a dielectric layer with an amorphous $Li_xTa_{1-x}O_3$ layer having a perovskite structure on the storage electrode, where X is between about 0.25 and 0.75; and forming a plate electrode including at least one conductive Layer on the dielectric layer.

17. The method of claim 16, wherein a Ta source gas for the amorphous $Li_xTa_{1-x}O_3$ layer is produced by evaporating a $Ta(OC_2H_5)_5$ solution supplied into an evaporator through a mass flow controller, at a temperature in a range of about 150° C. and 200° C.; a Li source gas for the $Li_xTa_{1-x}O_3$ layer is produced by evaporating a Li solution supplied into an evaporator through a mass flow controller, at a temperature in a range of about 100° C. and 400° C.; and the Li solution is prepared by dissolving a Li compound selected from the group comprising of lithium acetate ($C_2H_2LiO_2$), lithium hydroxide (LiOH) and lithium oxide ($Li_2O$) in deionized water or alcohol.

18. The method of claim 16, wherein the method further comprising an annealing process carried out at one of:

at a temperature of less than 600° C. in one of an $O_2$ atmosphere and a $N_2O$ atmosphere, and at a temperature in a range of about 300° C. and 600° C. in one of an $O_3$ atmosphere with UV light, an $O_3$ atmosphere, a $N_2O$ atmosphere and an $O_2$ atmosphere using plasma.

19. The method of claim 16, wherein, in performing nitridation on the surface of the storage electrode, the surface of the storage electrode is subject to one of:

annealing at a temperature in a range of about 200° C. and 500° C. in one of $NH_3$ atmosphere or a $N_2$ atmosphere using plasma, and a rapid thermal nitridation (RTN) at a temperature in a range of about 750° C. and 950° C. for about 1 and 5 minutes.

* * * * *

UNITED STATES PATENT AND TRADEMARK OFFICE
CERTIFICATE OF CORRECTION

PATENT NO. : 6,503,810 B2
DATED : January 7, 2003
INVENTOR(S) : Kee Jeung Lee

It is certified that error appears in the above-identified patent and that said Letters Patent is hereby corrected as shown below:

<u>Title page,</u>
Item [54], Title, replace "DIELETRIC" with -- DIELECTRIC --

Signed and Sealed this

Twenty-fourth Day of February, 2004

JON W. DUDAS
*Acting Director of the United States Patent and Trademark Office*